(12) United States Patent
Jiang et al.

(10) Patent No.: US 12,322,921 B2
(45) Date of Patent: Jun. 3, 2025

(54) OPTICAL GAIN MATERIALS FOR HIGH ENERGY LASERS AND LASER ILLUMINATORS AND METHODS OF MAKING AND USING SAME

(71) Applicant: Texas Tech University System, Lubbock, TX (US)

(72) Inventors: Hongxing Jiang, Lubbock, TX (US); Zhenyu Sun, Lubbock, TX (US); Yaqiong Yan, Lubbock, TX (US); Jing Li, Lubbock, TX (US); Jingyu Lin, Lubbock, TX (US)

(73) Assignee: Texas Tech University System, Lubbock, TX (US)

( * ) Notice: Subject to any disclaimer, the term of this patent is extended or adjusted under 35 U.S.C. 154(b) by 819 days.

(21) Appl. No.: 17/439,321

(22) PCT Filed: Mar. 12, 2020

(86) PCT No.: PCT/US2020/022780
§ 371 (c)(1),
(2) Date: Sep. 14, 2021

(87) PCT Pub. No.: WO2020/186226
PCT Pub. Date: Sep. 17, 2020

(65) Prior Publication Data
US 2023/0223741 A1 Jul. 13, 2023

Related U.S. Application Data

(60) Provisional application No. 62/818,365, filed on Mar. 14, 2019.

(51) Int. Cl.
*H01S 5/00* (2006.01)
*H01S 3/063* (2006.01)
(Continued)

(52) U.S. Cl.
CPC .......... *H01S 3/0632* (2013.01); *H01S 3/1608* (2013.01); *H01S 3/1628* (2013.01);
(Continued)

(58) Field of Classification Search
CPC .... H01S 3/0632; H01S 3/1608; H01S 3/1628; H01S 5/0265; H01S 5/2214; H01S 3/061;
(Continued)

(56) References Cited

U.S. PATENT DOCUMENTS 6,490,081 B1 * 12/2002 Feillens .............. H01S 3/06754
359/341.1
2003/0007763 A1 * 1/2003 Bazylenko .............. H01S 3/063
385/129
(Continued)

*Primary Examiner* — Kinam Park
(74) *Attorney, Agent, or Firm* — Dickinson Wright PLLC; Kristopher Lance Anderson

(57) ABSTRACT

Core-cladding planar waveguide (PWG) structures and methods of making and using same. The core-cladding PWG structures can be synthesized by hydride vapor phase epitaxy and processed by mechanical and chemical-mechanical polishing. An Er doping concentration of [Er] between $1 \times 10^{18}$ atoms/cm$^3$ and $1 \times 10^{22}$ atoms/cm$^3$ can be in the core layer. Such PWGs have a core region that can achieve optical confinement between 96% and 99% and above.

23 Claims, 11 Drawing Sheets

(51) Int. Cl.
    *H01S 3/16*           (2006.01)
    *H01S 5/026*         (2006.01)
    *H01S 5/22*           (2006.01)
    *H01S 3/06*           (2006.01)
    *H01S 3/0941*       (2006.01)

(52) U.S. Cl.
    CPC .......... H01S 5/0265 (2013.01); H01S 5/2214 (2013.01); *H01S 3/061* (2013.01); *H01S 3/0617* (2013.01); *H01S 3/0621* (2013.01); *H01S 3/0637* (2013.01); *H01S 3/09415* (2013.01); *H01S 3/1618* (2013.01); *H01S 3/1698* (2013.01); *H01S 2304/00* (2013.01)

(58) Field of Classification Search
    CPC .... H01S 3/0617; H01S 3/0621; H01S 3/0637; H01S 3/09415; H01S 3/1618; H01S 3/1698; H01S 2304/00
    See application file for complete search history.

(56) References Cited

U.S. PATENT DOCUMENTS

2003/0137722 A1*   7/2003   Nikolajsen ............ C03C 13/045
                                                      359/341.1
2005/0225815 A1*  10/2005   Patel .................... H01S 3/0632
                                                      359/1

* cited by examiner

Largest area PWG from 2-inch wafer
35.9 mm × 35.9 mm

Largest area PWG from 6 inch wafer
107.7 mm × 107.7 mm

Longest PWG from 2-inch wafer
10 mm × 49.8 mm longest PWG from 6 inch wafer
10 mm × 152 mm 2-inch wafer (50.8 mm)

6-inch wafer (152.4 mm)

FIG. 8C
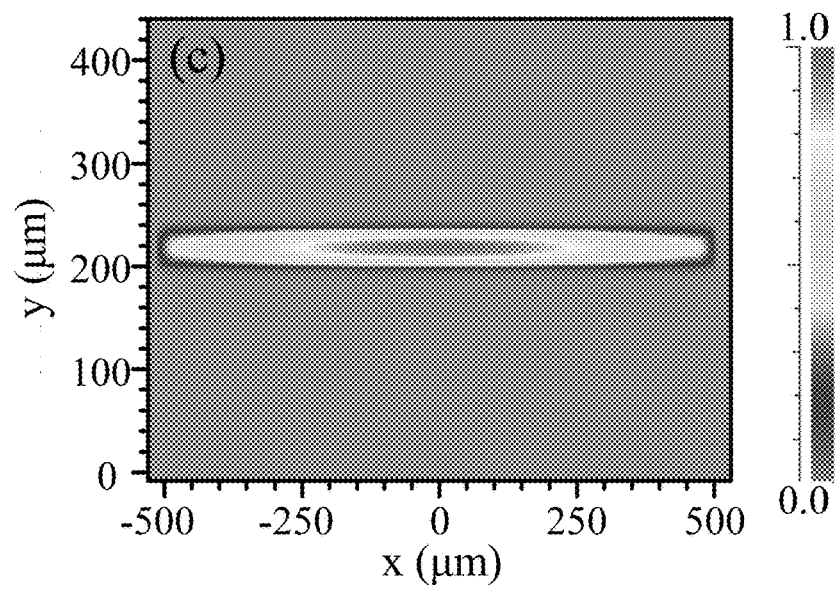
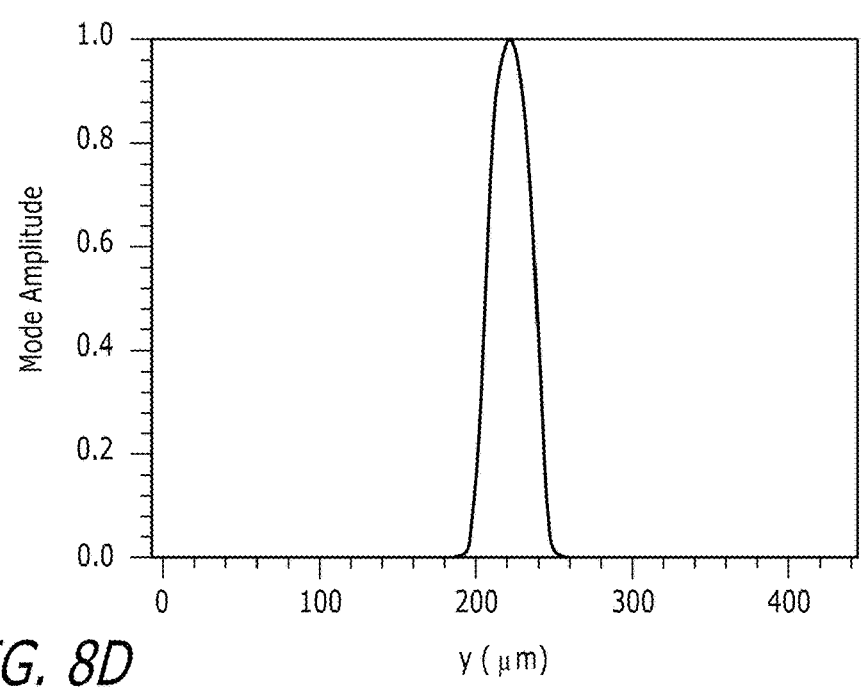
FIG. 8D

OPTICAL GAIN MATERIALS FOR HIGH ENERGY LASERS AND LASER ILLUMINATORS AND METHODS OF MAKING AND USING SAME

CROSS-REFERENCE TO RELATED APPLICATIONS

This application is a 35 U.S.C § 371 national application of PCT Application No. PCT/US20/22780, filed on Mar. 13, 2020, entitled "OPTICAL GAIN MATERIALS FOR HIGH ENERGY LASERS AND LASER ILLUMINATORS AND METHODS OF MAKING AND USING SAME", which claims priority to U.S. Patent Application Ser. No. 62/818,365, filed on Mar. 14, 2019, entitled "NOVEL OPTICAL GAIN MATERIALS FOR HIGH ENERGY LASERS AND LASER ILLUMINATORS", which are hereby incorporated herein by reference in their entirety for all purposes.

STATEMENT REGARDING FEDERALLY FUNDED RESEARCH

This invention was made with government support under grant/contract number N00014-17-1-2531 awarded by the Directed Energy—Joint Transition Office (JTO) through Office of Naval Research (ONR). The government has certain rights in the invention.

FIELD OF THE INVENTION

The present invention relates to solid-state and retina-safe high energy lasers and laser illuminators (HELs) based on erbium doped GaN (Er:GaN) quasi-bulk crystals and a method of fabricating gain medium for HELs in the geometries of single crystal core-cladding planar waveguides (PWGs) and optical fibers with the capabilities to outperform HELs based on traditional gain medium such as neodymium doped synthetic crystal of yttrium aluminum garnet (Nd:YAG) in terms of maximum operating power, power density, beam quality, eye safety, and atmospheric transmittance.

BACKGROUND

Solid-state high energy lasers (HELs) and laser illuminators have been a subject of great interest and under intense development for applications in defense, industrial processing, communications, medicine, spectroscopy, imaging and various other applications [Kalisky 2010; Huber 2010; Koechner 1999; Vetovec 2002; Giesen 2007]. The optical gain medium is the heart of a HEL system. Presently, neodymium doped synthetic crystal of yttrium aluminum garnet (Nd:YAG) emitting at 1.06 μm is one of the most dominant gain medium materials for HELs due partly to the highly developed crystal growth technologies of Nd:YAG. On the other hand, HELs operating at 1.5 μm wavelength region are highly sought-after for applications especially where the laser is expected to travel long distances in free space. Not only the 1.5 μm wavelength window matches with the technologically important wavelength of the minimum propagation loss in optical fibers for telecommunications, but it is also more "retina-safe" as this wavelength is absorbed by the surface of the eye instead of being focused inside at the retina [Boettner 1962], resulting in more than 4 orders of magnitude increase in the upper limit of eye-safe laser exposure power at 1.5 μm over that of the wavelength close to 1 μm or shorter [Zuclich 2007]. Moreover, 1.5 μm lasers also have a higher atmospheric transmittance than that of 1.06 μm lasers [Bailey 2007]. Other applications such as laser radar, rangefinders, target illuminators, IR countermeasures, free space communications, war games devices, and laser weapons can also benefit from the development of improved eye-safer laser sources.

When doped in a host, the emission lines resulting from the intra-4f transitions from the first excited state manifold ($^4I_{13/2}$) to the ground state manifold ($^4I_{15/2}$) in erbium ions ($Er^{3+}$) are near 1.5 μm [Desurvire 1994; Mears 1987; Becker 1999; Connelly 2002]. Great progress has been made in the development of HEL gain materials based on Er doped YAG (Er:YAG) [Fan '046 Patent; Ter-Gabrielyan 2013; Spariosu 2006]. However, with the relatively poor thermal properties of YAG having a thermal conductivity of $\kappa \approx 14$ W/m·K and thermal expansion coefficient of $\alpha \approx 8 \times 10^{-6\circ}$ C.$^{-1}$, the heat dissipation capability of YAG gain medium is relatively poor, which limits the optical output energy and average power. It is presently recognized that damage to the optical gain medium caused by the laser beam flux itself is a principal limitation on further improvement of lasing efficiency [Kalisky 2010; Huber 2010; Koechner 1999; Vetovec 2002; Giesen 2007]. Therefore, the development of new gain materials and structures with improved heat dissipation capability is highly desirable.

SUMMARY OF INVENTION

The present invention is directed to core-cladding planar waveguide (PWG) structures and methods of making and using same. The core-cladding PWG structures can be synthesized by hydride vapor phase epitaxy and processed by mechanical and chemical-mechanical polishing.

In general, in one aspect, the invention features a core-cladding planar waveguide (PWG) structure that includes a core layer comprising Er:GaN. The core layer has a uniform Er doping concentration. The core-cladding PWG structure further includes a first GaN layer including undoped GaN. The core-cladding PWG structure further includes a second GaN layer including undoped GaN. The core layer is between the first GaN layer and the second GaN layer.

Implementations of the invention can include one or more of the following features:

A first side of the core layer can be adjacent a first side of the first GaN layer. A second side of the core layer can be adjacent a first side of the second GaN layer.

The core-cladding PWG structure can further include a first transition layer that is between a first side of the first GaN layer and a first side of the core layer. A first side of the first transition layer can be adjacent the first side of the first GaN layer. A second side of the first transition layer can be adjacent the first side of the core layer. Er doping of the first transition layer can be increasing in concentration from the first side of the first transition layer to the second side of the first transition layer. The core-cladding PWG structure can further include a second transition layer that is between a first side of the second GaN layer and a second side of the core layer. A first side of the second transition layer can be adjacent the second side of the core layer. A second side of the second transition layer can be adjacent the first side of the second GaN layer. Er doping of the second transition layer can be decreasing in concentration from the first side of the second transition layer to the second side of the second transition layer.

The Er doping of the first transition layer can be increasing from a concentration of 0 at the first side of the first transition layer to the Er doping concentration of the core layer at the second side of the first transition layer. The Er doping of the second transition layer can be decreasing from the Er doping concentration of the core layer at the first side of the second transition layer to a concentration of 0 at the second side of the second transition layer.

The uniform Er doping of the core layer can be a concentration of at least $1\times10^{18}$ atoms/cm$^3$.

The uniform Er doping of the core layer can have a concentration between $1\times10^{18}$ atoms/cm$^3$ and $1\times10^{22}$ atoms/cm$^3$.

The uniform Er doping of the core layer can be a concentration of at least $1\times10^{19}$ atoms/cm$^3$.

The uniform Er doping of the core layer can have a concentration between $1\times10^{19}$ atoms/cm$^3$ and $1\times10^{21}$ atoms/cm$^3$.

The core-cladding PWG structure can have a GaN/Er:GaN/GaN core-cladding PWG structure.

The core layer can be co-doped with Er and Yb.

The Er and Yb doping of the core layer can have a concentration between $1\times10^{18}$ atoms/cm$^3$ and $1\times10^{22}$ atoms/cm$^3$.

The Er and Yb doping of the core layer can have a concentration between $1\times10^{19}$ atoms/cm$^3$ and $1\times10^{21}$ atoms/cm$^3$.

The core layer can have a thickness between of at least 5 μm.

The core layer can have a thickness between of 5 μm and 200 μm.

The first GaN layer can have a thickness between 330 μm and 400 μm. The second GaN layer can have a thickness between 330 μm and 400 μm.

The core-cladding PWG structure can be a strip having a longitudinal axis.

The core-cladding PWG structure can have a waveguide width that is at most ⅕ the length of the strip along the longitudinal axis.

In general, in another aspect, the invention features a core-cladding planar waveguide (PWG) structure that includes a core strip including Er:GaN. The core strip has a longitudinal axis. The core strip has a uniform Er doping concentration. The core-cladding PWG structure further includes a GaN layer of undoped GaN that surrounds the core strip along the longitudinal axis.

Implementations of the invention can include one or more of the following features:

The GaN layer can be adjacent the core strip along the longitudinal axis.

The core-cladding PWG structure can further include a transition layer that is between the GaN layer and the core strip. A first side of the transition layer can be adjacent the GaN layer along the longitudinal axis. A second side of the transition layer can be adjacent the core strip. Er doping of the transition layer can be increasing in concentration between the first side of the transition layer to the second side of the transition layer.

The core-cladding PWG structure of claim 16, wherein the Er doping of the transition layer can be increasing from a concentration of 0 at the first side of the transition layer to the Er doping concentration of the core stripe at the second side of the transition layer.

The uniform Er doping of the core strip can have a concentration of at least $1\times10^{18}$ atoms/cm$^3$.

The uniform Er doping of the core strip can have a concentration between $1\times10^{18}$ atoms/cm$^3$ and $1\times10^{22}$ atoms/cm$^3$.

The uniform Er doping of the core strip can have a concentration of at least $1\times10^{19}$ atoms/cm$^3$.

The uniform Er doping of the core strip can have a concentration between $1\times10^{19}$ atoms/cm$^3$ and $1\times10^{21}$ atoms/cm$^3$.

The core core-cladding PWG structure can be a GaN/Er:GaN/GaN core-cladding PWG structure.

The core strip can be uniformly co-doped with Er and Yb.

The Er and Yb doping of the core strip can have a concentration between $1\times10^{18}$ atoms/cm$^3$ and $1\times10^{22}$ atoms/cm$^3$.

The Er and Yb doping of the core strip can have a concentration between $1\times10^{19}$ atoms/cm$^3$ and $1\times10^{21}$ atoms/cm$^3$.

In general, in another aspect, the invention features a method of forming a core-cladding planar waveguide (PWG) structure. The method includes the step of selecting an undoped GaN substrate. The method further includes the step of growing a first transition layer on a first side of the undoped GaN substrate. The first transition layer has a first side and a second side. The first side of the undoped GaN substrate is adjacent the first side of the first transition layer. Er doping of the first transition layer is increase in concentration from the first side of the first transition layer to the second side of the first transition layer. The method further includes the step of growing a core layer including Er:GaN on the second side of the first transition layer. The core layer has a first side and a second side. The second side of the first transition layer is adjacent to the first side of the core layer. The core layer has a uniform Er doping concentration. The method further includes the step of growing a second transition layer on the second side of the core layer. The second transition layer has a first side and a second side. The second side of the core layer is adjacent the first side of the second transition layer. Er doping of the first transition layer is decreased in concentration from the first side of the second transition layer to the second side of the second transition layer. The method further includes the step of growing an undoped GaN layer on the second side of the second transition layer to form a core-cladding structure.

Implementations of the invention can include one or more of the following features:

The method can further include dicing the core-cladding structure to a pre-determined waveguide width to obtain the core-cladding PWG structure.

The method can further include lapping and polishing the core-cladding PWG structure.

The polishing can include mechanical and/or chemical-mechanical polishing.

The core-cladding PWG structure can have a longitudinal axis.

The pre-determined waveguide width can be at most ⅕ the length of the core-cladding PWG structure along the longitudinal axis.

The step of growing the first transition layer can include a first hydride vapor phase epitaxy (HVPE) growth process. The step of growing the core layer can include a second HVPE growth process. The step of growing the second transition layer c can include a third HVPE growth process. The step of growing the undoped GaN layer can include a fourth HVPE growth process.

The method can be performed utilizing one or more HVPE reactors.

Each of the steps of growing the first transition layer, growing the core layer, growing the second transition layer, and growing the undoped GaN layer can include utilizing at least one of the one or more HVPE reactors.

The method can further include the step of, after the step of growing of the core layer utilizing one of the one or more HVPE reactors to form the intermediate structure comprising the undoped GaN substrate, the first transition layer, and the core layer, removing the intermediate structure from the one or more HVPE reactors. The method can further include the step of lapping and polishing the intermediate structure to attain a pre-determined thickness of the core layer. The method can further include the step of, after the step of lapping and polishing the intermediate structure, placing the intermediate structure into the one or more HVPE reactors for performing the step of the step of growing the second transition layer.

The polishing can include mechanical and/or chemical-mechanical polishing.

The Er doping of the first transition layer can be increased from a concentration of 0 at the first side of the first transition layer to the Er doping concentration of the core layer at the second side of the first transition layer. The Er doping of the second transition layer can be decreased from the Er doping concentration of the core layer at the first side of the second transition layer to a concentration of 0 at the second side of the second transition layer.

The uniform Er doping of the core layer can have a concentration of at least $1 \times 10^{18}$ atoms/cm$^3$.

The uniform Er doping of the core layer can have a concentration between $1 \times 10^{18}$ atoms/cm$^3$ and $1 \times 10^{22}$ atoms/cm$^3$.

The uniform Er doping of the core layer can have a concentration of at least $1 \times 10^{19}$ atoms/cm$^3$.

The uniform Er doping of the core layer can have a concentration between $1 \times 10^{19}$ atoms/cm$^3$ and $1 \times 10^{21}$ atoms/cm$^3$.

The core-cladding PWG structure can be a GaN/Er:GaN/GaN core-cladding PWG structure.

The core layer can be uniformly co-doped with Er and Yb.

The Er and Yb doping of the core layer can have a concentration between $1 \times 10^{18}$ atoms/cm$^3$ and $1 \times 10^{22}$ atoms/cm$^3$.

The Er and Yb doping of the core layer can have a concentration between $1 \times 10^{19}$ atoms/cm$^3$ and $1 \times 10^{21}$ atoms/cm$^3$.

The core layer can have a thickness of at least 5 μm.

The core layer can have a thickness between 5 μm and 200 μm.

The undoped GaN substrate can have a thickness between 330 μm and 400 μm. The undoped GaN layer can have a thickness between 330 μm and 400 μm.

In general, in another aspect, the invention features . . . 48. A method of forming one or more core-cladding planar waveguide (PWG) structures. The method includes the step of selecting an undoped GaN substrate having a first side. The method further includes the step of growing a core layer comprising Er:GaN. The core layer has a first side and a second side. The first side of the core layer is facing the first side of the undoped GaN substrate. The core layer has a uniform Er doping concentration. The method further includes the step of growing a first undoped GaN layer to form a first intermediate structure. The first undoped GaN layer has a first side. The first side of the first undoped GaN layer is facing the second side of the core layer. The method further includes the step of dicing the first intermediate structure into a plurality of strips. The strips in the plurality of strips each has a first side, a second side, a third side, and a four side running a longitudinal axis. The first side is undoped GaN. The second side is a first diced surface. The third side is undoped GaN. The fourth side is the second diced surface. The method further includes the step of processing one or more strips in the plurality of strips by the further steps of (i) lapping and polishing the strip, (ii) growing a second undoped GaN layer facing the second side of the strip, and (iii) growing a third undoped GaN layer facing the fourth side of the strip to form a core-cladding planar waveguide (PWG) structure having undoped GaN surrounding the core layer in the strip along the longitudinal axis.

Implementations of the invention can include one or more of the following features:

The step of growing the core layer can include growing the core layer on the first side of the undoped GaN substrate. The step of growing the first undoped GaN layer can include growing the first undoped GaN layer on the second side of the core layer.

The step of growing the second undoped GaN layer can include growing the second undoped GaN layer on the second side of the strip. The step of growing the third undoped GaN layer can include growing the third undoped GaN layer on the fourth side of the strip.

Before the step of growing a core layer, the method can further include growing a first transition layer on the first side of the undoped GaN substrate. The first transition layer can have a first side and a second side. The first side of the undoped GaN substrate can be adjacent the first side of the first transition layer. Er doping of the first transition layer can be increased in concentration from the first side of the first transition layer to the second side of the first transition layer. The step of growing the core layer can include growing the core layer on the second side of the first transition layer such that the first side of the core layer is adjacent the second side of the first transition layer. Before the step of growing the first undoped GaN layer, the method can further include growing a second transition layer on the second side of core layer. The second transition layer can have a first side and a second side. The second side of the core layer can be adjacent the first side of the second transition layer. Er doping of the second transition layer can be decreased in concentration from the first side of the second transition layer to the second side of the second transition layer. The step of growing the first undoped GaN layer can include growing the first undoped GaN layer on the second side of the second transition layer such that the first side of the GaN layer is adjacent the second side of the second transition layer.

Before the step of growing the second undoped GaN layer, the method can further include growing a third transition layer on the second side of the strip. The third transition layer can have a first side and a second side. The first side of the third transition layer can be adjacent the second side of the strip. Er doping of the third transition layer can be decreased in concentration from the first side of the third transition layer to the second side of the third transition layer. The step of growing the second undoped GaN layer can include growing the second undoped GaN layer on the second side of the third transition layer such that the first side of the second undoped GaN layer is adjacent the second side of the third transition layer. Before the step of growing the third undoped GaN layer, the method can further include growing a fourth transition layer on the fourth side of the strip. The fourth transition layer can have a first side and a second side. The first side of the fourth transition layer can be adjacent the fourth side of the strip. The Er doping of the fourth transition layer can be decreased in concentration from the first side of the fourth transition layer to the second side of the fourth transition layer. The step of growing the third undoped GaN layer can include growing the third undoped GaN layer on the second side of the fourth transition layer such that the first side of the third undoped GaN layer is adjacent the second side of the fourth transition layer.

The uniform Er doping of the core layer can have a concentration of at least $1\times10^{18}$ atoms/cm$^3$.

The uniform Er doping of the core layer can have a concentration between $1\times10^{18}$ atoms/cm$^3$ and $1\times10^{22}$ atoms/cm$^3$.

The uniform Er doping of the core layer can have a concentration of at least $1\times10^{19}$ atoms/cm$^3$.

The uniform Er doping of the core layer can have a concentration between $1\times10^{19}$ atoms/cm$^3$ and $1\times10^{21}$ atoms/cm$^3$.

The core-cladding PWG structure can be a GaN/Er:GaN/GaN core-cladding PWG structure.

The core layer can be uniformly co-doped with Er and Yb.

The Er and Yb doping of the core layer can have a concentration between $1\times10^{18}$ atoms/cm$^3$ and $1\times10^{22}$ atoms/cm$^3$.

The Er and Yb doping of the core layer can have a concentration between $1\times10^{19}$ atoms/cm$^3$ and $1\times10^{21}$ atoms/cm$^3$.

The core layer can have a thickness between of at least 5 μm.

The core layer can have a thickness between of 5 μm and 200 μm.

The undoped GaN substrate can have a thickness between 330 μm and 400 μm. The first undoped GaN layer can have a thickness between 330 μm and 400 μm. The second undoped GaN layer can have a thickness between 330 μm and 400 μm. The third undoped GaN layer can have a thickness between 330 μm and 400 μm.

In general, in another aspect, the invention features a core-cladding planar waveguide (PWG) structure that includes a core layer including Er:GaN. The core layer has a uniform Er doping concentration. The core-cladding PWG structure further includes a first layer comprising $Al_xGa_{1-x}N$ and a second layer comprising $Al_xGa_{1-x}N$, with x being between 0 and 1, inclusive. The core layer is between the first layer and the second layer.

Implementations of the invention can include one or more of the following features:

The core-cladding PWG structure can further include a first transition layer between the first layer and the core layer. The first transition layer can have an Er doping concentration that increases between (i) a first surface of the first transition layer adjacent to the first layer, and (ii) a second surface of the first transition layer adjacent the core layer. The core-cladding PWG structure can further include a second transition layer between the core layer and the second layer. The second transition layer can have an Er doping concentration that decreases between (i) a first surface of the second transition layer adjacent to the core layer, and (ii) a second surface of the second transition layer adjacent the second layer.

In general, in another aspect, the invention features a core-cladding planar waveguide (PWG) structure that includes a core strip including Er:GaN. The core strip has a longitudinal axis. The core strip has a uniform Er doping concentration. The core-cladding PWG structure further includes a first layer of $Al_xGa_{1-x}N$ that surrounds the core strip along the longitudinal axis, with x being between 0 and 1, inclusive.

Implementations of the invention can include one or more of the following features:

The core-cladding PWG structure can further include a transition layer between the core strip and the first layer. The transition layer can have an Er doping concentration that increases between (i) a first surface of the first transition layer adjacent to the first layer, and (ii) a second surface of the transition layer adjacent the core strip.

In general, in another aspect, the invention features

A device comprising any of the above core-cladding planar waveguide (PWG) structures. The core-cladding PWG structure is a gain medium in the device.

Implementations of the invention can include one or more of the following features:

The device can be selected from a group consisting of optical amplifiers, laser illuminators, and high-energy lasers.

The device can be operable to operate in a retina safe window.

The device can further include a resonant pump.

The core-cladding PWG structure can have a core region operable to have an optical confinement of at least 96%.

The core-cladding PWG structure can have a core region operable to have an optical confinement between 96% and 99%.

The core-cladding PWG structure can have a core region operable to have an optical confinement of at least 99%.

BRIEF DESCRIPTION OF DRAWINGS

FIGS. 8A-8D depict optical intensity distribution of a representative GaN/Er:GaN/GaN core-cladding PWG. FIG. 8A is a schematic of a GaN/Er:GaN/GaN core-cladding PWG consisting of a 40 μm Er:GaN core and 200 μm GaN claddings. The waveguide structure has a width (along x-axis) of 1 mm and a length (along z-axis) of 5 mm and an Er doping concentration in the core of $3 \times 10^{19}$ atoms/cm$^3$. FIG. 8B is an optical intensity distribution across the Er:GaN core region and along the propagation direction, z-axis. FIG. 8C is a transverse electric (TE) mode profile of the x-y cross-section plane. FIG. 8D is a mode amplitude profile along y-axis.

DETAILED DESCRIPTION

Figure 1A:
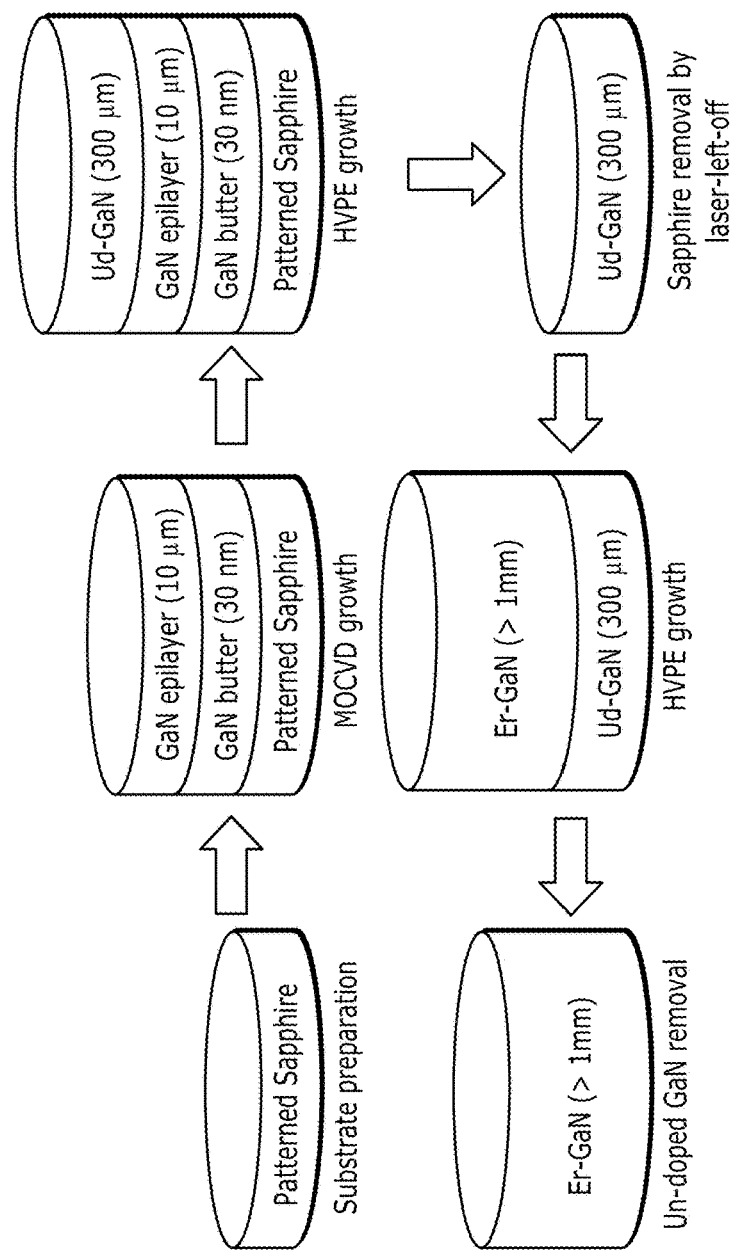
FIG. 1A is a flow chart for obtaining freestanding Er doped GaN (Er:GaN) quasi-bulk crystals.

III-nitride wide bandgap semiconductor materials (i.e., GaN and its family members of InN, InGaN, AlN, AlGaN, and their alloy combinations), which have demonstrated excellent performances in high power, high temperature electronics and optoelectronics [Bergh 2001; Narukawa 2007; Day 2011; Nakamura 2000], are very promising as a gain medium material for HELs. It was established that in erbium (Er) doped III-nitrides (Er:InGaN, Er:GaN and Er:AlN, Er:AlGaN, and Er:InAlGaN) the emission resulting from the intra-4f transition from the first excited manifold ($^4I_{13/2}$) to the ground state ($^4I_{15/2}$) in Er$^{3+}$ ions is around 1.5 μm [Favennec 1989]. To the first order, the maximum achievable lasing power ($P_{max}$) for a solid-state laser gain medium attached to a heat sink is characterized roughly by the thermal shock parameter, $P_{max} \sim \kappa/\alpha^2$, where κ is the thermal conductivity and α is the thermal expansion coefficient of the gain material. TABLE I presents a comparison between important material parameters for using Nd:YAG or Er:GaN as an optical gain medium for high energy lasers. GaN has a much larger thermal conductivity (κ=253 W/m·K) [Shibata 2007] and lower thermal expansion coefficient (α≈3.53×10$^{-6\circ}$ C.$^{-1}$) [Shibata 2007] than YAG (κ=14 W/m·K, α≈8×10$^{-6\circ}$ C.$^{-1}$).

TABLE 1

Comparison of important material parameters between Nd:YAG and Er:GaN as optical gain medium for high energy lasers

| Laser gain material | Nd:YAG | Er:GaN bulk crystals |
|---|---|---|
| Crystal structure | Cubic | Wurtzite |
| Lattice constant (Å) | 12.01 | α = 3.186, c = 5.186 |
| Moh Hardness | 8.5 | 9 |
| Emission wavelength, $\lambda_{emi}$ (μm) | ~1.06 | ~1.54 |
| Thermal conductivity, κ (W/m · K) @ 300K | 14 | 253 |
| Density (g/cm$^3$) | 4.56 | 6.15 |
| Melting temperature (° C.) | 1970 | >2500 |
| Radiative lifetime (ms) | 0.95 | 2.8 |
| Thermal expansion coefficient (× 10$^{-6}$ ° C.$^{-1}$) | 8 | 3.53 |
| Index of Refraction, n @ $\lambda_{emi}$ | 1.82 | 2.34 |

Thus, the theoretical maximum lasing power of HELs based on Er:GaN can surpass that of those based on Nd:YAG by a factor up to 90. Moreover, with GaN possessing a small variation of the refractive index (n) with temperature (T), dn/dT=0.7×10$^{-5\circ}$ C.$^{-1}$ at 1.5 μm [Hui 2005], GaN host potentially provides an excellent beam quality. Furthermore, due to its wide energy bandgap nature, it was shown that the 1.5 μm emission in Er:GaN has an excellent thermal stability [Favennec 1989; Ugolini 2006]. Therefore, with superior thermal and mechanical properties, HELs based on Er:GaN are potentially capable of outperforming YAG HELs in terms of maximum operating power, power density and beam quality as well as eye-safety and atmospheric transmittance.

Although Er:GaN is known to have a great potential to offer many advantages as a HEL gain medium over more traditional optical gain materials such as Nd:YAG, most of the previous works were limited to Er doped III-nitride epitaxial layers of only a few microns in thickness produced by epitaxial growth techniques such as metal organic chemical vapor deposition (MOCVD) or molecular beam epitaxy (MBE) with a focus on applications of Er:GaN for light emitting diodes, full color displays, and chip scale amplifiers for optical communications [Ugolini 2006; Wilson 1994; Garter 1999; Zavada 2004; Steckl 2002; Dahal 2010; Jiang '328 patent; Dahal 2009]. The material growth technologies for producing Er:GaN quasi-bulk crystals (crystals with a thickness from tens to thousands of microns) which are needed for the construction of active optical gain medium in various geometries for HELs have not been in existence until recently [Jeon 2015; Sun 2016; Sun 2017; Sun 2018].

Figure 1B:
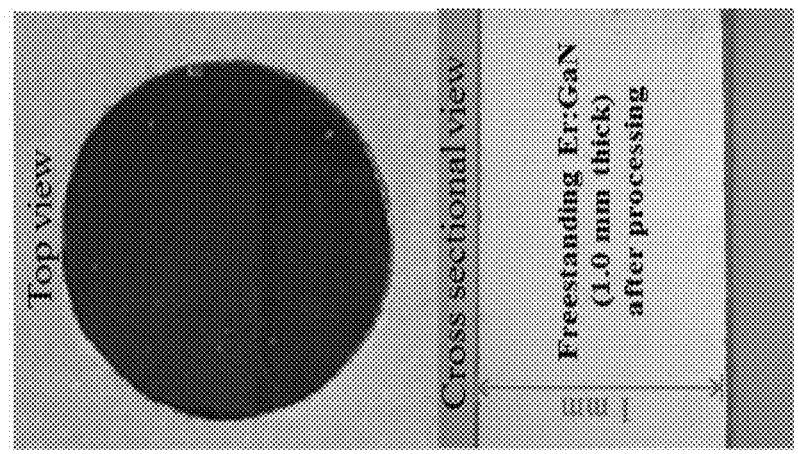
FIG. 1B are optical images of a freestanding Er:GaN wafer of 1 mm in thickness.
Figure 2B:
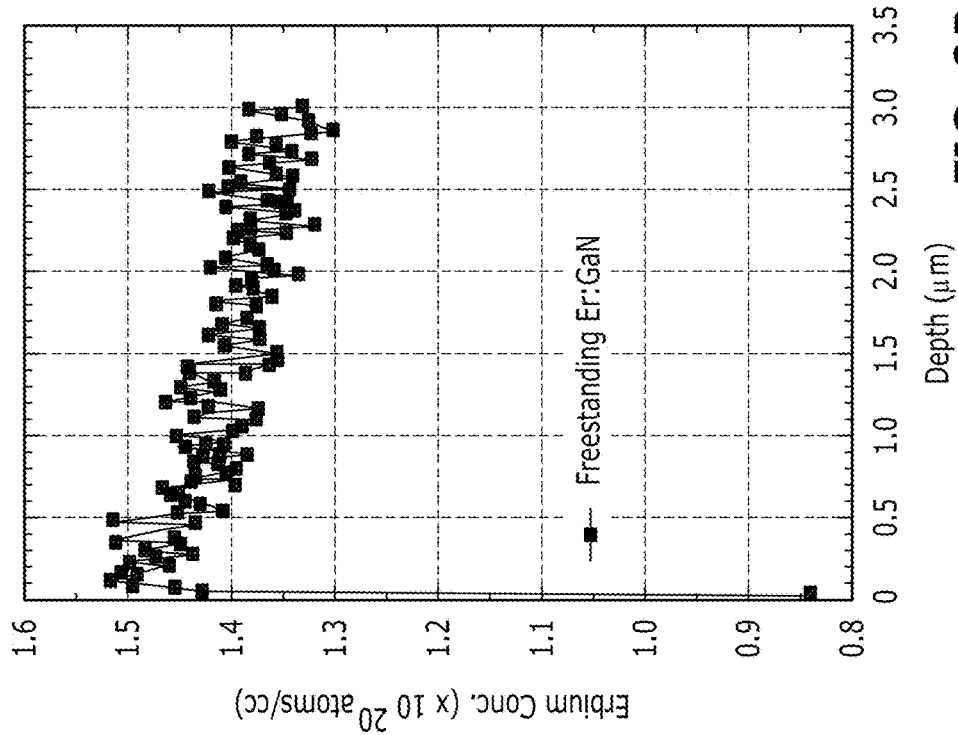
FIG. 2B is a graph of Er concentration profile in a 1 mm thick freestanding Er:GaN quasi-bulk crystal probed by secondary mass spectrometry (SIMS) up to 3 μm in depth from a polished surface.
Figure 2A:
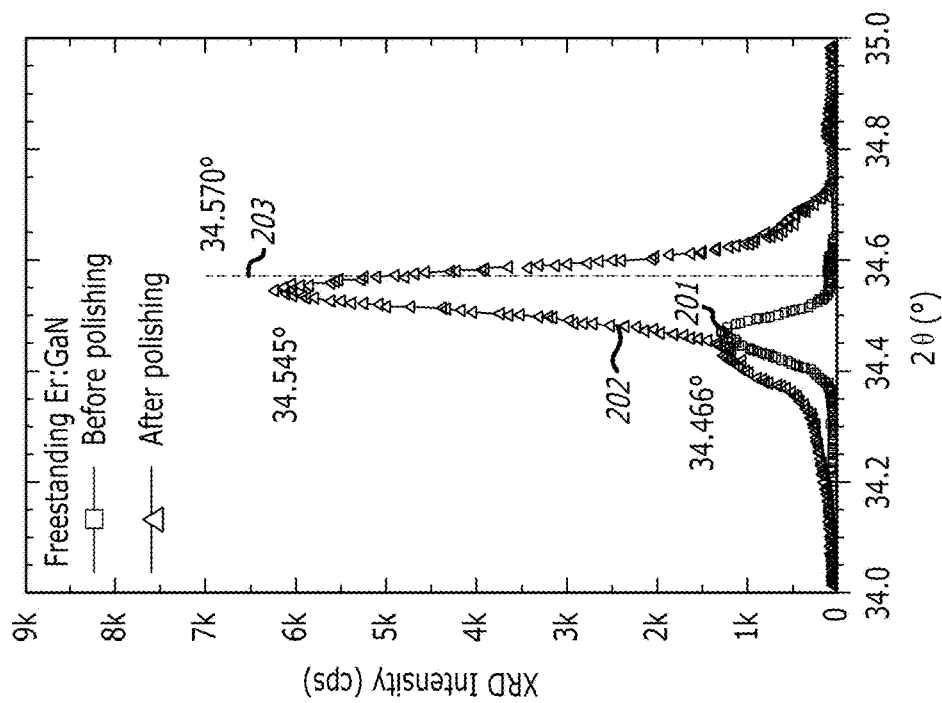
FIG. 2A is a graph of XRD θ-2θ scans of the GaN (0002) diffraction peak of a freestanding Er:GaN sample before polishing (1.2 mm in thickness) and after double-side polishing (1 mm in thickness).

The present inventors have recently developed a hydride vapor phase epitaxy (HVPE) growth technique for the synthesis of Er:GaN quasi-bulk single crystal wafers [Jeon 2015; Sun 2016; Sun 2017; Sun 2018]. HVPE technique is an established technique with abilities to employ high purity precursors to provide GaN quasi-bulk crystal growth with high crystalline quality at a growth rate as high as hundreds of microns per hour [Motokia 2002]. As illustrated in FIGS. 1A-1B, freestanding single crystal Er:GaN wafers with thicknesses on the millimeter scale has been obtained via HVPE growth in conjunction with a laser-lift-off (LLO) process [Sun 2016; Sun 2017; Sun 2018]; the realized Er:GaN bulk materials are single crystals as demonstrated by the x-ray diffraction (XRD) results shown in FIG. 2A, which shows the X-ray diffraction (XRD) θ-2θ scans of the GaN (0002) diffraction peaks of a freestanding Er:GaN sample before (plot 201) and after (plot 202) subjected to a chemical-mechanical polishing (CMP) processing. (Dashed line 203 at 34.570° represents the position of the 2θ diffraction angle of the GaN (0002) peak in strain-free undoped GaN). Comparison of the peak positions at 34.466° and 34.545°, respectively, for the wafer before and after CMP with the 2θ diffraction peak of strain-free GaN (0002) at 34.570°, reveals the presence of a compressive strain in Er:GaN wafer. However, the smoothing of the surface and removal of shallow defects by CMP can reduce the stress in the wafer, as suggested by the observed shift of the 2θ diffraction peak position toward that of the strain-free GaN (0002) after wafer CMP.

The presence of a slight difference in the peak positions of the 2θ angle between the polished freestanding Er:GaN sample and the strain-free GaN is due to the fact that the size of Er atom is larger than that of the Ga atom and the majority of Er ions in GaN occupy Ga substitutional sites [Mishra 2007; Wahl 2003]. In one example, an Er doping level of $1.4 \times 10^{20}$ atoms/cm$^3$ has been confirmed by secondary ion mass spectrometry (SIMS) measurement (FIG. 2B) [Sun 2016].

Figure 3C:
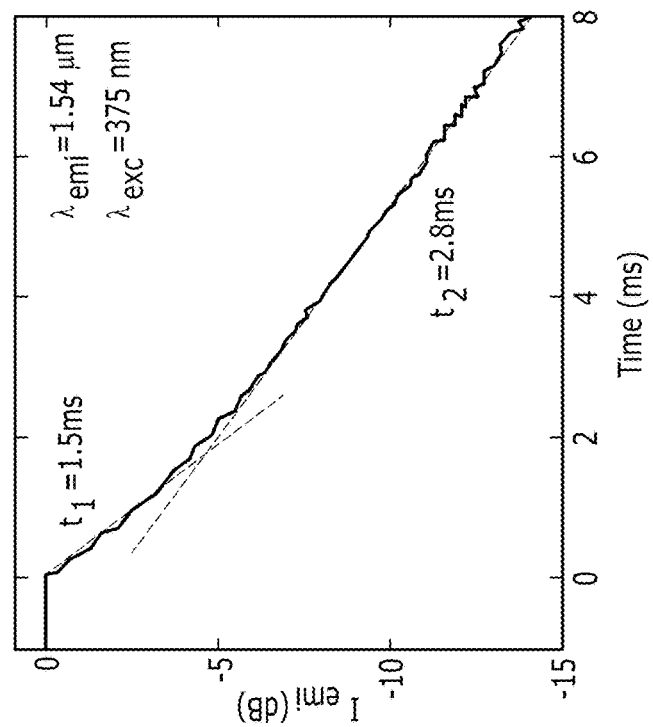
FIG. 3C is a graph showing the 1.54 μm emission decay kinetics in Er:GaN excited by a 375 nm laser diode measured at room temperature.
Figure 3A:
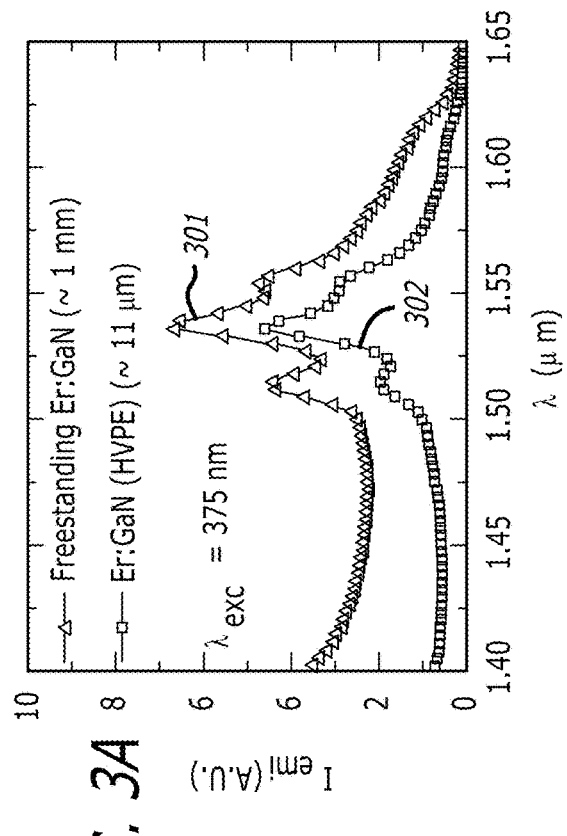
FIG. 3A is a graph showing the comparison of room temperature PL spectra of freestanding Er:GaN samples of two different thicknesses of 1 mm and 11 μm excited by band-edge excitation at $\lambda_{exc}$=375 nm.
Figure 3B:
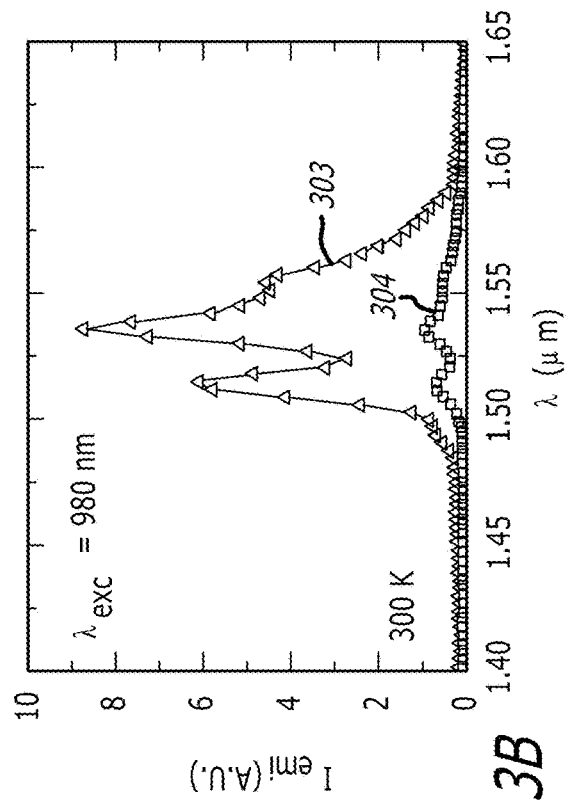
FIG. 3B is a graph showing is the comparison of room temperature PL spectra of freestanding Er:GaN samples of two different thicknesses of 1 mm and 11 μm excited by resonant excitation at $\lambda_{exc}$=980 nm.

As shown in FIGS. 3A-3B, the freestanding Er:GaN wafers exhibit strong emission at 1.54 μm with their emission intensity increasing dramatically with wafer thickness under 980 nm resonant excitation. In FIGS. 3A-3B, plots 301 and 303 are for freestanding ER:GaN (~1 mm) and plots 302 and 304 are for ER:GaN (HVPE) (~11 μm).

The results shown in FIGS. 3A-3B can be explained by the fact that the band-edge photons at 375 nm have a large optical excitation cross section ($4.6 \times 10^{-17}$ cm$^2$) [Feng 2003], translating to a small penetration depth of <2 μm. This means that the 375 nm photons are completely absorbed within the top surface of 2 μm. Therefore, increasing the sample thickness has no effects on the PL emission intensity at 1.54 μM. In contrast, 980 nm photons provide a resonant excitation in Er$^{3+}$ with an excitation cross section of about $2.2 \times 10^{-21}$ cm$^2$ [Wang 2011], giving a penetration depth of >1 mm. Therefore, the 1 mm freestanding Er:GaN wafer absorbs much more power of 980 nm excitation laser than the 11 μm thick wafer, resulting in a much higher emission intensity at 1.54 μm.

Figure 3D:
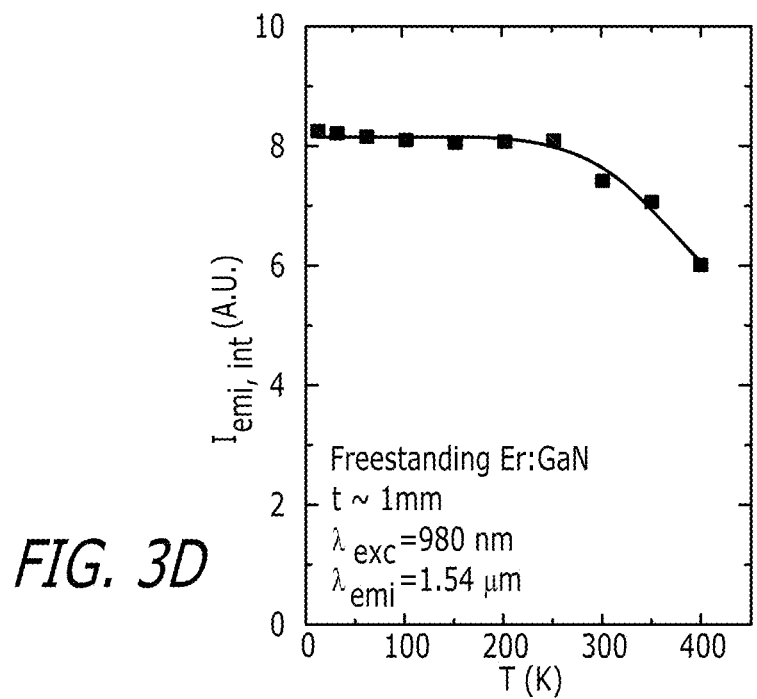
FIG. 3D is a graph showing the 1.54 μm emission intensity of a 1 mm thick freestanding Er:GaN sample as a function of temperature.
Figure 4A:
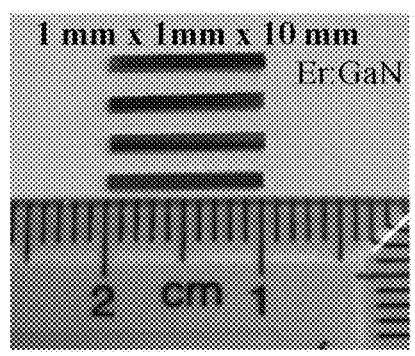
FIGS. 4A-4B are optical images of various laser structures (rods in FIG. 4A and disks in FIG. 4B) fabricated from 2-inch diameter Er:GaN quasi-bulk crystals via HVPE growth, laser cutting and chemical and mechanical polishing (CMP).
Figure 4B:
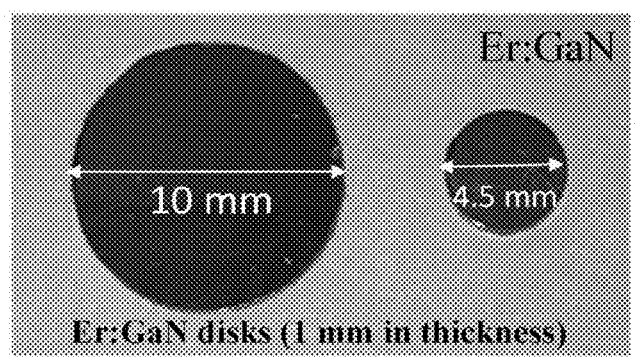

As shown in FIG. 3C, the decay lifetime constant of the 1.54 μm emission is on the millisecond scale. These results establish the basis for achieving carrier inversion between $^4I_{13/2}$ to $^4I_{15/2}$ levels and lasing emission at 1.54 μm. A very low thermal quenching of only 10% for the 1.54 μm emission intensity between 10 K and 300 K has been measured (FIG. 3D), confirming that 1.54 μm emission in Er:GaN is highly thermally stable at room and elevated temperatures [Sun 2016]. As shown in FIG. 4A-4B, various Er:GaN laser structures, including laser rods (FIG. 4A) and disks (FIG. 4B) have been successfully fabricated.

These results show that it is feasible to produce Er:GaN quasi-bulk crystals with high crystalline quality by HVPE and opened up new prospects of employing Er:GaN as an outstanding gain medium for HELs. However, to enable practical optical amplifier or laser applications, the design geometry of the gain medium material can make a huge difference to the overall laser performance. A need remains in the art of growth, processing and fabrication of Er:GaN optical gain medium in appropriate geometries.

The present invention pertains to the synthesis of Er doped III-nitride quasi-bulk crystals and the associated optical gain medium structures by HVPE and fabrication of optical gain medium in suitable geometries for HEL and laser illuminators operating at the "retina-safe" wavelength window (near 1.5 μm). A gain medium of HEL or laser illuminator must be fabricated into appropriate geometries, such as disks, rods, slabs, and core cladding planar waveguides (PWG) and core cladding fiber-like structures to provide an effective optical confinement, pumping efficiency, and hence optimal performance. Among different geometries, the core-cladding structures have the advantages of reduced optical loss, enhanced optical gain and reduced lasing threshold as the optical energy is confined in the core layer. In particular, the core-cladding PWG structure possesses a sufficiently large surface area to provide an excellent heat removal capability, thereby minimizing the thermal impact during high power/energy operation. The core-cladding structures are also highly compatible with high-power laser diode clad pumping schemes [Grivas 2011]. Therefore, GaN/Er:GaN/GaN core-cladding structures in various form factors represent a very promising design architecture to realize a new generation gain medium for HELs. This present invention teaches how to realize optical gain medium in the core-cladding PWG and core-cladding fiber-like geometries.

The principle for realizing core-cladding Er:GaN gain medium structures is based on the fact that the refractive index of Er doped GaN increases almost linearly with an increase in the Er doping concentration [Alajlouri 2014]. This property together with HVPE growth capabilities leads to a very unique and important advantage of Er:GaN gain material synthesized by HVPE, which is that in principle we can synthesize core-cladding structures (such as PWGs) in a single growth run by using Er doped layer as the core and undoped GaN as the gladding layers so that the highly effective clad pumping scheme can be employed.

Figure 5:
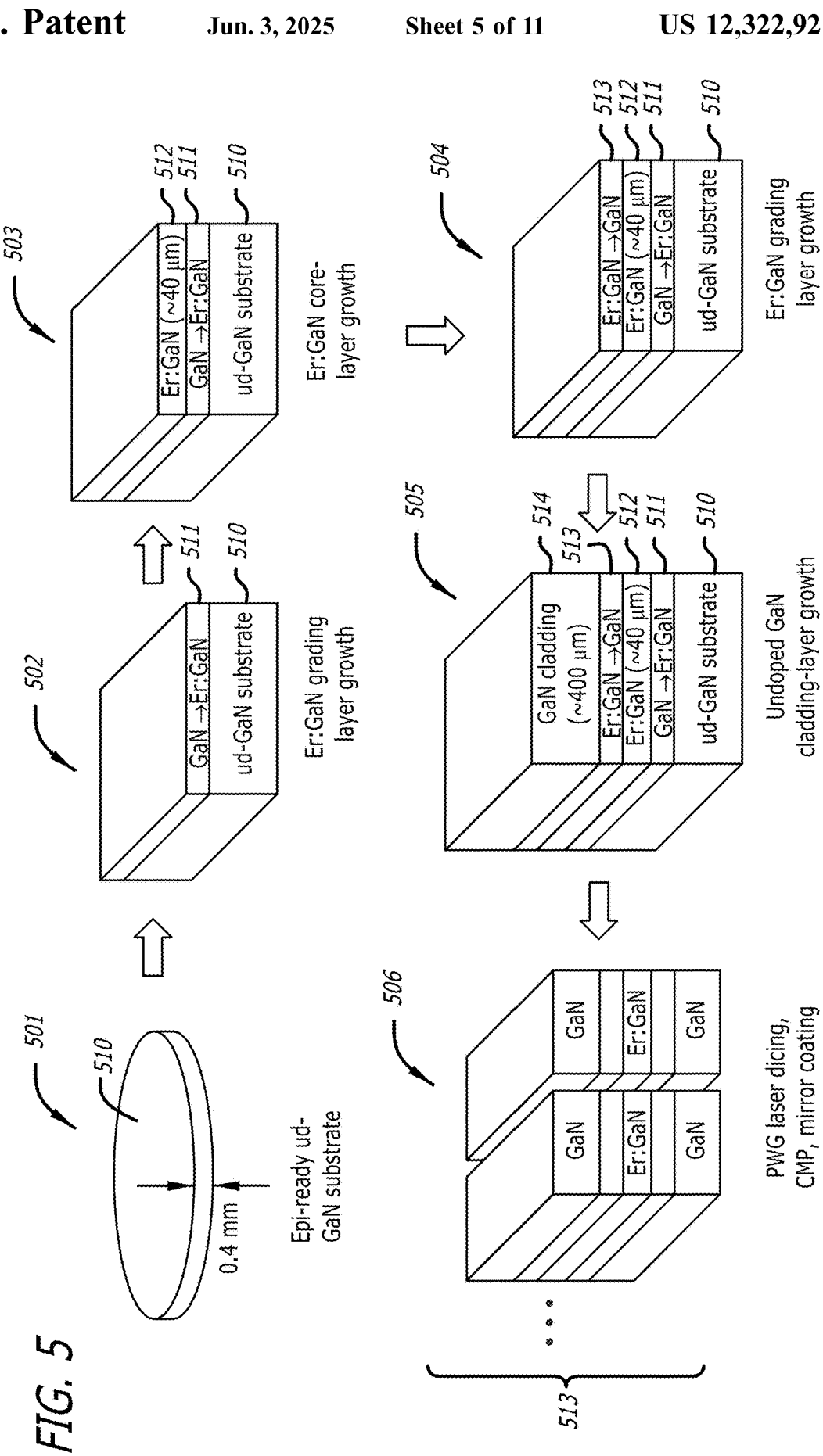
FIG. 5 is a flow chart for synthesizing and processing GaN/Er:GaN/GaN core-cladding planar waveguide (PWG) optical gain medium structures by HVPE growth, laser dicing, and chemical and mechanical polishing (CMP).

One embodiment of the present invention, shown in FIG. 5, provides a method for fabricating a core-cladding PWG 513 by starting, in step 501, from an epi-ready undoped GaN bulk substrate 510. In step 502, a transition layer 511 with a certain thickness (e.g., ~20 μm) with Er doping level gradually increasing from undoped GaN to Er:GaN is grown. In step 503, the method is followed by the growth of the Er:GaN layer 512 with a uniform Er doping concentration to serve as the core-layer. The thickness of this core layer can be varied for example from 30 μm to 200 μm depending on application scenarios. After the growth of the Er:GaN core layer 512, in step 504, another transition layer 513 with a certain thickness (e.g., ~20 μm) with Er doping level gradually decreasing from Er:GaN to undoped GaN is grown, In step 505, the method is followed by the growth of ~400 μm thick undoped GaN 514 as the top cladding layer. The insertion of the transition layers 511 and 513 before and after the Er:GaN core layer 512 is to mitigate any disadvantageous effects of stain induced by the slight lattice mismatch between Er:GaN and undoped GaN, as the lattice constant of Er:GaN is slightly larger than GaN because the atomic size of Er is larger than Ga, a case which is suggested by the XRD results shown in FIG. 2A. After the HVPE growth, in step 506, the wafer is diced into strips (or waveguides) with a desired waveguide width to obtain GaN/Er:GaN/GaN core-cladding PWGs 515. Each side of PWG 515 is subject to lapping, mechanical and chemical-mechanical polishing (CMP) to minimize the optical loss.

Figure 6:
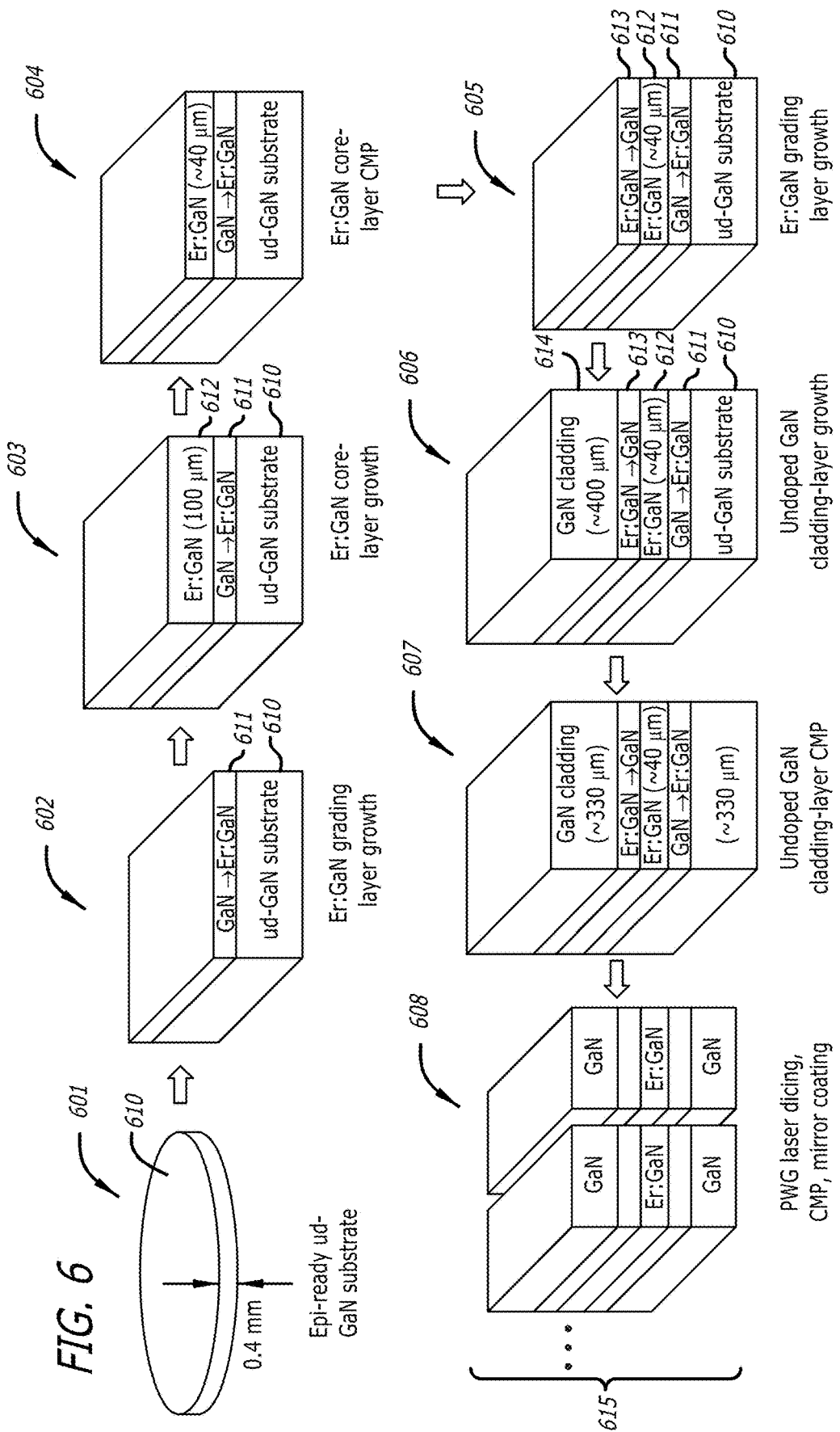
FIG. 6. is another flow chart for synthesizing and processing GaN/Er:GaN/GaN core-cladding planar waveguide (PWG) optical gain medium structures by HVPE growth, laser dicing, and chemical and mechanical polishing (CMP), and HYPE re-growth.

Another embodiment of the present invention, shown in FIG. 6, provides a method for fabricating a core-cladding PWG 615 by starting from, in step 601, an epi-ready undoped GaN bulk substrate 610. In step 602, a transition layer 611 of a certain thickness (e.g., ~20 μm) with Er doping level gradually increasing from undoped GaN to Er:GaN is grown. In step 603, the method is followed by the growth of the Er:GaN layer 612 with a uniform Er doping concentration to serve as the core-layer. The thickness of this core layer 612 can be as thick as 200 μm. After the growth of the Er:GaN core layer, in step 604, the Er:GaN/GaN wafer is taken out from the HVPE reactor and processed by lapping, mechanical and chemical-mechanical polishing to attain a desired thickness (e.g., 30 µm thick Er:GaN core layer). The purpose of CMP processing is to improve the surface morphology and make the Er:GaN/GaN wafer truly epi-ready for the subsequent growth of the undoped GaN cladding layer in case the as-grown surface of Er:GaN is not ideal for subsequent growth, as the incorporation of Er during HVPE growth process may cause surface roughness. In step 605, the epi-ready Er:GaN/GaN wafer is then put back into the HVPE reactor and proceeds with the re-growth on the epi-ready Er:GaN/GaN wafer of another transition layer 613 with a certain thickness (e.g., ~20 µm) with Er doping level gradually decreasing from Er:GaN to undoped GaN. In step 606, the method is followed by the growth of a ~400 µm thick undoped GaN 614 as the top cladding layer. After the HVPE growth, in step 607, the wafer is diced into strips (or waveguides) with a desired waveguide width to obtain GaN/Er:GaN/GaN core-cladding PWGs. In step 608, each side of PWG 615 is subject to lapping, mechanical and chemical-mechanical polishing (CMP) to minimize the optical loss.

Figure 7C:
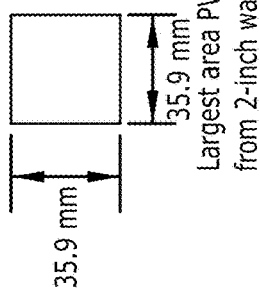
FIGS. 7A-7C are illustrations of the longest length and largest area of PWGs that can be fabricated from Er:GaN quasi-bulk crystals of 2-inches in diameter.
Figure 7F:
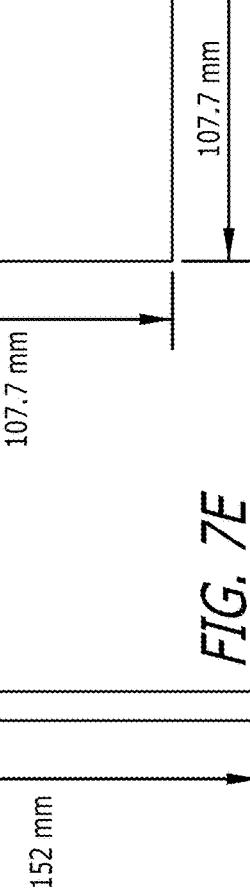
FIGS. 7D-7F are illustrations of the longest length and largest area of PWGs that can be fabricated from Er:GaN quasi-bulk crystals of 6-inches in diameter.
Figure 7B:
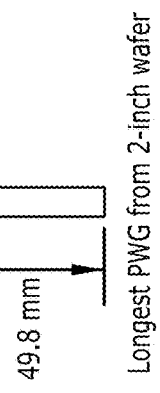
Figure 7E:
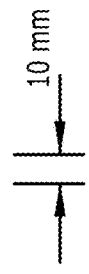
Figure 7A:
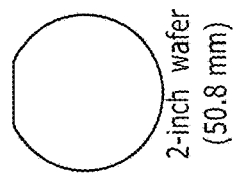
Figure 7D:
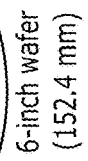

As shown schematically in FIGS. 7D-7F, the longest PWG that can be fabricated from 6-inch wafers is about 15 cm, whereas, as shown schematically in FIGS. 7A-7C, the longest PWG that can be fabricated from 2-inch wafers is about 5 cm. However, a single wafer can be diced into many strips with different widths and different lengths to obtain PWGs of various sizes. The largest square shaped PWG can be fabricated from a 6-inch wafer is 107.7 mm×107.7 mm.

Due to the refractive index difference between undoped GaN cladding layer and the Er:GaN core layer, a GaN/Er:GaN/GaN PWG provides an excellent optical confinement along the c-axis of GaN, thereby enable an excellent efficiency for the pumping laser that excites the $Er^{3+}$ ions in the core region. FIGS. 8A-8D show the optical intensity distribution in a representative core-cladding PWG consisting of GaN (200 µm)/Er:GaN (40 µm)/GaN (200 µm) layer structure shown in FIG. 8A with a waveguide width of 1 mm in the horizontal (x−) direction and a length of 5 mm in the propagation (z−) direction. Using an Er doping concentration of [Er]=$3\times10^{19}$ atoms/$cm^3$ in the Er:GaN core layer, the refractive index difference between the Er:GaN core layer and the GaN cladding layer is 0.00172 [Alajlouri 2014].

Figure 8A:
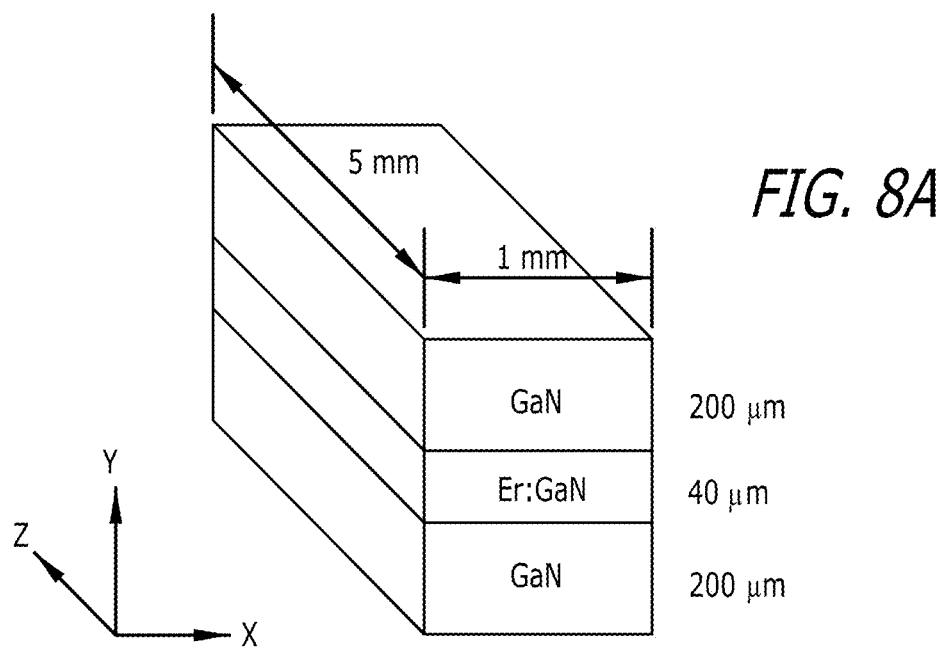
Figure 8B:
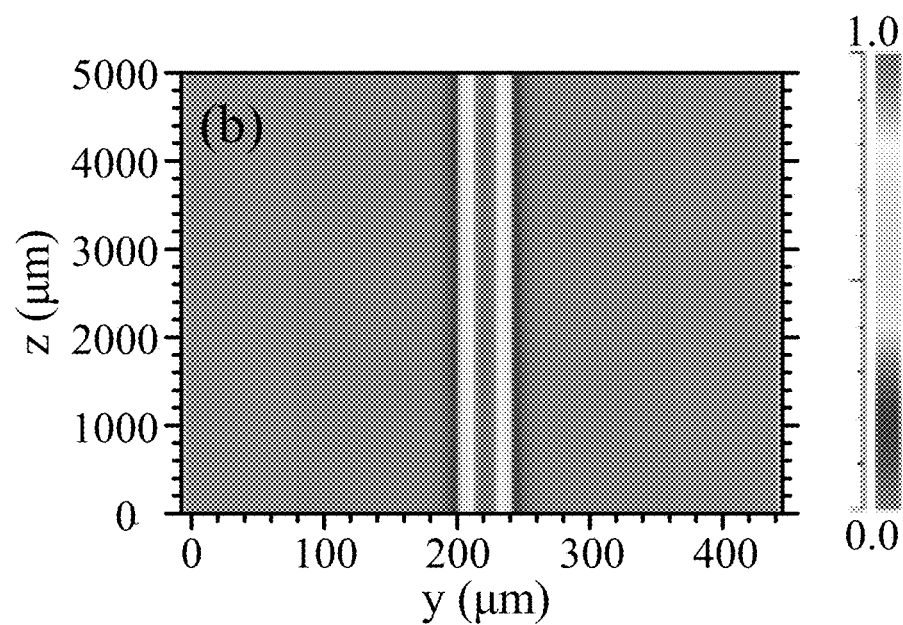

FIG. 8B presents the optical intensity distribution across the Er:GaN (40 µm) core and along the propagation z-direction, without considering propagational losses. FIG. 8C shows the transverse electric (TE) mode profile of the x-y cross-section at any z position, indicating a good optical confinement. FIG. 8D shows the corresponding mode amplitude profile along the y-axis (across the Er:GaN core region) at any z position.

A 94% of optical confinement of the power can be achieved in the 40 µm Er:GaN core region. TABLE II shows that by fixing the top and bottom cladding layer thickness at 200 µm, changing the thickness of the Er:GaN core layer from 5 µm to 200 µm, and the Er doping level in the core layer from $1\times10^{19}$ $cm^{-3}$ to $1\times10^{21}$ $cm^{-3}$, the corresponding optical confinement factor (%) can be controlled.

TABLE II

Optical confinement in GaN/Er:GaN/GaN core-cladding PWGs (measured in percent)

| d(µm) | $N_{Er}$ ($\times 10^{19}$ $cm^{-3}$) | | | | | | | | | | | | |
|---|---|---|---|---|---|---|---|---|---|---|---|---|---|
| | 1 | 2 | 3 | 4 | 5 | 6 | 7 | 8 | 9 | 10 | 20 | 50 | 100 |
| 5 | 10.3 | 23.8 | 33.4 | 40.6 | 46.4 | 50.8 | 54.8 | 57.9 | 57.9 | 60.6 | 76.2 | 88.0 | 93.1 |
| 10 | 28.7 | 48.3 | 59.0 | 65.9 | 70.7 | 74.2 | 77.2 | 81.0 | 82.7 | 84.3 | 90.8 | 96.3 | 98.0 |
| 15 | 43.8 | 62.8 | 72.0 | 77.5 | 81.1 | 84.0 | 85.9 | 87.9 | 89.3 | 90.6 | 95.9 | 98.2 | 99.1 |
| 20 | 58.8 | 74.7 | 81.8 | 85.9 | 89.0 | 91.1 | 92.7 | 93.9 | 94.7 | 95.3 | 97.5 | 98.9 | 99.5 |
| 30 | 70.5 | 83.5 | 86.6 | 93.2 | 95.2 | 96.1 | 96.7 | 97.1 | 97.4 | 97.7 | 98.8 | 99.5 | 99.7 |
| 40 | 77.1 | 88.9 | 94.0 | 96.3 | 97.2 | 97.6 | 98.0 | 98.2 | 98.4 | 98.5 | 99.3 | 99.7 | 99.8 |
| 50 | 81.3 | 92.0 | 96.0 | 97.4 | 98.0 | 98.3 | 98.5 | 98.7 | 98.9 | 99.0 | 99.5 | 99.8 | 99.9 |
| 60 | 84.3 | 93.6 | 96.9 | 98.0 | 98.4 | 98.7 | 98.9 | 99.0 | 99.1 | 99.2 | 99.6 | 99.8 | 99.9 |
| 70 | 86.1 | 94.4 | 97.4 | 98.3 | 98.7 | 98.9 | 99.1 | 99.2 | 99.3 | 99.3 | 99.7 | 99.9 | 99.9 |
| 80 | 87.3 | 95.0 | 97.6 | 98.5 | 98.9 | 99.1 | 99.2 | 99.3 | 99.4 | 99.4 | 99.7 | 99.9 | 99.9 |
| 90 | 88.1 | 95.3 | 97.8 | 98.6 | 99.0 | 99.2 | 99.3 | 99.4 | 99.4 | 99.5 | 99.7 | 99.9 | 99.9 |
| 100 | 88.9 | 95.5 | 97.8 | 98.7 | 99.1 | 99.2 | 99.3 | 99.4 | 99.5 | 99.5 | 99.8 | 99.9 | 100.0 |
| 200 | 92.2 | 96.4 | 98.0 | 98.8 | 99.3 | 99.5 | 99.6 | 99.7 | 99.7 | 99.7 | 99.9 | 100.0 | 100.0 |

Top and bottom cladding layer thickness = 200 µm
Core thickness = d (µm)
Er concentration in the core = $N_{Er}$ ($\times 10^{19}$ $cm^{-3}$)

For the case with the Er:GaN core layer thickness of 50 µm and a doping concentration of $3\times10^{19}$ atoms/$cm^3$ and the top and bottom cladding layer thickness of 200 µm, an optical confinement as high as 96% can be obtained in the Er:GaN core region. In another case with the Er:GaN core layer thickness of 50 µm and a doping concentration of $1\times10^{20}$ atoms/$cm^3$ and the top and bottom cladding layer thickness of 200 µm, an optical confinement as high as 99% can be obtained in the Er:GaN core region.

Figure 9:
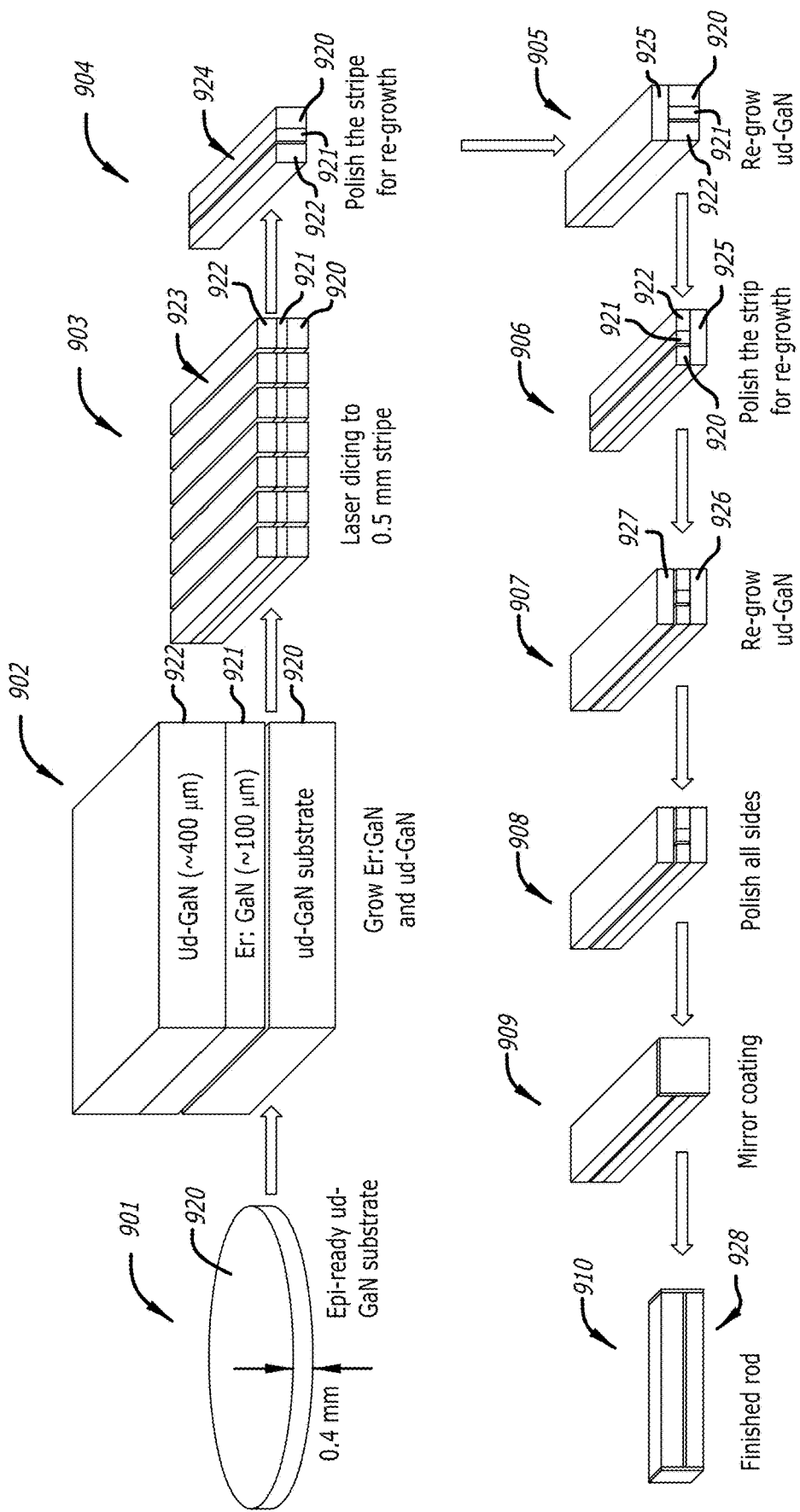
FIG. 9 is a flow chart for synthesizing and processing GaN/Er:GaN/GaN core-cladding fiber gain medium structures by HVPE growth, laser dicing, chemical and mechanical polishing (CMP) and HVPE re-growth.

One embodiment of the present invention provides a method for fabricating a core-cladding all crystal fibers 928, as shown in FIG. 9. These devices are expected to enable lasers and laser illuminators with much more output power than those using conventional glass fibers. In step 901, the method starts from an epi-ready undoped GaN bulk substrate 920. In step 902, a Er:GaN core layer 921 is grown, followed by the growth of ~400 µm thick undoped GaN as a cladding layer 922. After the HVPE growth, in step 903, the wafer is diced into strips 922. In step 904, each strip 923 is subjected to CMP to obtain smooth surfaces in an epi-ready state (polished strips 924). In step 905, the polished strip 924 is then put back into HVPE reactor for the re-growth of ~400 µm thick undoped GaN as a cladding layer 925 on one of the diced surfaces. In step 906, the method is then followed by another CMP and, in step 907, another regrowth of undoped GaN cladding layer 926 to complete the formation of a core-cladding fiber structure 927. In step 908, the core-cladding fiber structure 927 is subjected to final CMP and, in step 909, mirror coating to enhance the performance (finished core cladding fiber 928). The maximum length of a finished core cladding fiber 928 fabricated from a 6-inch diameter wafers is 15 cm. With an appropriate core diameter, which can be varied, and high Er concentration up to ~$10^{21}$ cm$^{-3}$, these structures should be capable of producing high power output under resonant pump using 980 nm laser diodes.

In another embodiment of the present invention, the core region is co-doped with Er and Yb. Co-doping significantly alters the Er dopant's environment. The absorption cross section of Yb$^{3+}$ at 980 nm is about 7 times larger than that of Er$^{3+}$, and its absorption band extends over a wider wavelength region, between 850 nm and 1000 nm [Koechner 1999]. The energy is then transferred resonantly from Yb$^{3+}$ to the $^4I_{11/2}$ state of Er$^{3+}$. Therefore, Yb and Er co-doping scheme can enhance the effective excitation cross section and hence the pumping efficiency at 980 nm by a factor of 7. The Er and Yb doping concentrations can be varied from a few $10^{19}$/cm$^3$ to $10^{21}$/cm$^3$ depending on specific applications.

In another embodiment of the present invention, the cladding layer is Al$_x$Ga$_{1-x}$N with x varying from 0 to 1. Since the refractive index of Al$_x$Ga$_{1-x}$N monotonically decreases with an increase of the Al molar fraction [Hui 2005], compared to the use of undoped GaN as cladding layers, the use of undoped Al$_x$Ga$_{1-x}$N as cladding layers can enhance the optical confinement in the Er:GaN core region and makes the design of single mode PWG with ease.

Figure 10:
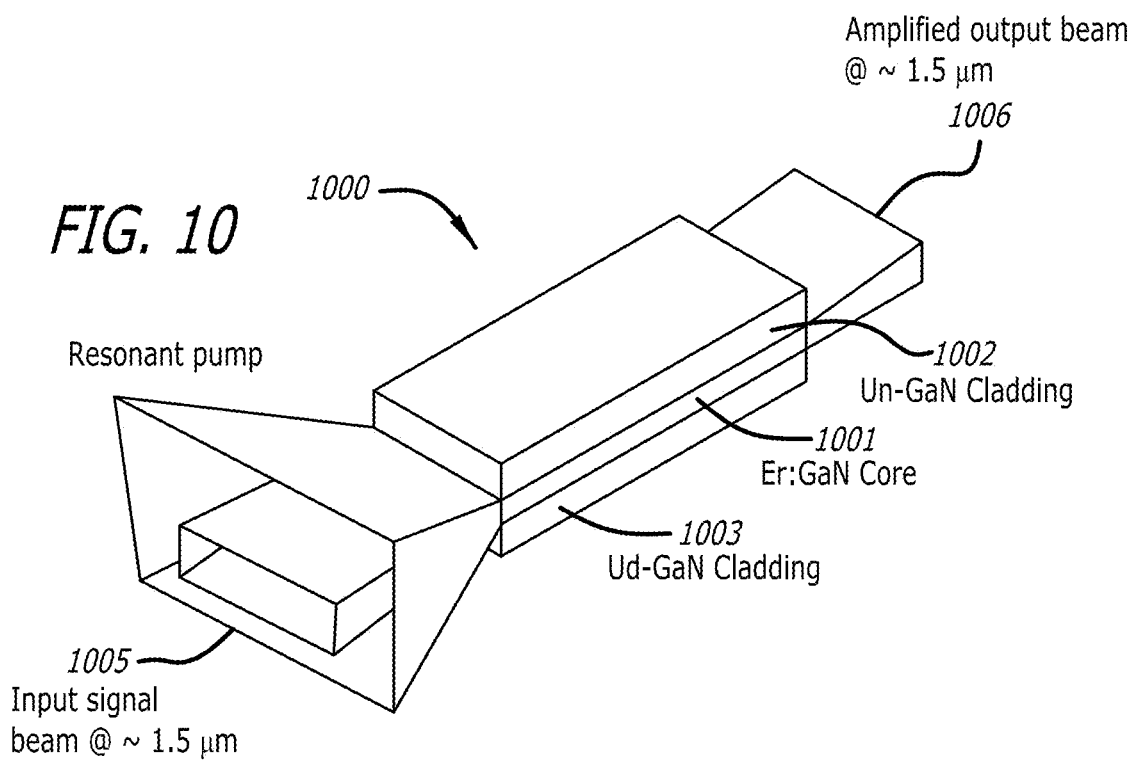
FIG. 10 is a schematic of employing GaN/Er:GaN/GaN core-cladding PWG/core-cladding fiber structure as a gain medium in an optical amplifier/laser illuminator.

In another embodiment of the present invention, as shown in FIG. 10, the core-cladding PWG or core-cladding fiber based on Er:GaN of this invention (that includes an Er:GaN core 1001 and Un-GaN Cladding 1002-1003) can be utilized as a gain medium in an optical amplifier or a laser illuminator 1000, in which the incoming signal 1005 (around 1.5 μm) can be amplified via a resonant pump 1004 using a 980 nm laser diode to an amplified output beam 1006 (around 1.5 μm).

Figure 11:
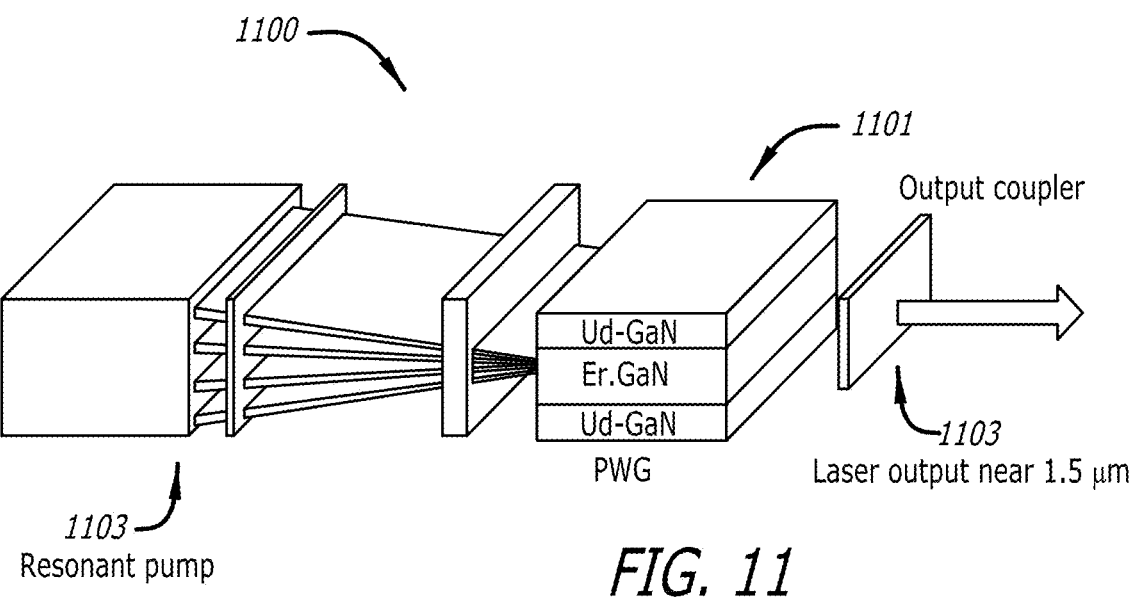
FIG. 11 is a schematic of employing GaN/Er:GaN/GaN core-cladding PWG structure as a gain medium in a high energy laser.

In another embodiment of the present invention, as shown in FIG. 11, the core-cladding PWG or core-cladding fiber 1101 based on Er:GaN can be utilized as a gain medium in a high energy laser 1100, which is capable to provide lasing emission 11002 near 1.5 μm via a resonant pump 1103 using a 980 nm laser diode or laser diode stack. Previous results have also indicated that other possible pump lines in Er:GaN are 1514 nm and 1539 nm for a quasi-four-level and quasi-three-level system, respectively, whereas the lasing emission lines are most likely to occur at 1569 nm and 1581 nm, conforming to the requirements of an extremely small quantum defect lasing system. Thus, the resonant pumping source can also be a 1514 nm or a 1539 nm laser diode or laser diode stack. Pumped by a 1514 nm laser, the GaN/Er:GaN/GaN core-cladding PWGs HELs can provide lasing emission in the retina-safe spectral region with a high quantum efficiency and extremely low quantum defect.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

Amounts and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about" and "substantially" when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

REFERENCES CITED

U.S. Pat. No. 4,995,046, "Room temperature 1.5 μm band quasi-three-level laser," issued Feb. 19, 1991, to Y. X. Fan et al. ("Fan '046 patent").

U.S. Pat. No. 8,227,328 "Er doped III-nitride materials and devices synthesized by MOCVD," issued Jul. 24, 2012 to H. X. Jiang, et al. ("Jiang '328 patent").

S. Alajlouni et al., "Refractive index of erbium doped GaN thin films," *Appl. Phys. Lett.*, 105, 081104 (2014) ("Alajlouni 2014").

J. Bailey et al., "Correcting Infrared Spectra for Atmospheric Transmission," *Publications of the Astronomical Society of the Pacific*, 119, 228 (2007) ("Bailey 2007").

P. C. Becker et al., "Erbium-Doped Fiber Amplifiers: Fundamentals and Technology," Academic Press (1999) ("Becker 1999").

A. Bergh et al., "The promise and challenge of solid-state lighting," *Phys. Today*, 54, 42 (2001) ("Bergh 2001").

E. A. Boettner et al., "Transmission of the Ocular Media," *Invest. Ophth.*, 1, 776 (1962) ("Boettner 1962").

M. J. Connelly, "Semiconductor Optical Amplifiers," Springer (2002) ("Connelly 2002").

R. Dahal, et al., "1.54 µm emitters based on erbium doped InGaN p-i-n junctions," *Appl. Phys. Lett.*, 97, 141109, (2010) ("Dahal 2010").

R. Dahal et al., "Erbium-doped GaN optical amplifiers operating at 1.54 µm," *Appl. Phys. Lett.*, 95, 111109 (2009) ("Dahal 2009").

J. Day et al., "III-Nitride full-scale high-resolution microdisplays," *Appl. Phys. Lett.*, 99, 031116 (2011) ("Day 2011").

E. Desurvire, "Erbium-doped Fibre Amplifiers: Principles and Applications," John Wiley & Sons (1994) ("Desurvire 1994").

P. N. Favennec et al., "Luminescence of erbium implanted in various semiconductors: IV, III-V and II-VI materials," *Electron. Lett.*, 25, 718 (1989) ("Favennec 1989").

I. W. Feng et al., "Optical excitation cross section of erbium in GaN," *Applied Optics*, 52, 61132 (2013) ("Feng 2003").

M. Garter et al., "Visible and infrared rare-earth-activated electroluminescence from indium tin oxide Schottky diodes to GaN:Er on Si," *Appl. Phys. Lett.*, 74, 182 (1999) ("Garter 1999").

A. Giesen et al., "Fifteen years of work on thin-disk lasers: results and scaling laws," *IEEE J. Selected Topics in Quantum Electronics*, 13, 598 (2007) ("Giesen 2007").

C. Grivas, "Optically pumped planar waveguide lasers, Part I: Fundamentals and fabrication techniques," *Progress in Quantum Electroni*, 35, 159 (2011) ("Grivas 2011").

G. Huber et al., "Solid-state lasers: status and future", *J. Opt. Soc. Am.*, 27, B93 (2010) ("Huber 2010").

R. Hui et al., "III-nitride-based planar lightwave circuits for long wavelength optical communications," *IEEE J. Quantum Electronics*, 41, 100 (2005) ("Hui 2005").

D. W. Jeon, et al., "Erbium doped GaN synthesized by hydride vapor-phase epitaxy," *Optical Materials Express*, 5, 596 (2015) ("Jeon 2015").

Y. Kalisky et al., "The status of high-power lasers and their applications in the battlefield," *Opt. Eng.*, 49, 091003 (2010) ("Kalisky 2010").

W. Koechner, "Solid-state laser engineering", 5$^{th}$ edition, Spring-Verlag, Berlin Heidelberg, (1999) ("Koechner 1999").

R. J. Mears et al., "Low-Noise Erbium-Doped Fiber Amplifier Operating at 1.54-µm," *Electron Lett.*, 23, 1026 (1987) ("Mears 1987").

K. C. Mishra et al., "A First-Principles Investigation of the Electronic Structure of Trivalent Rare Earth Ions in Gallium Nitride," *Z. Phys. Chem.*, 221, 1663 (2007) ("Mishra 2007").

K. Motoki et al., "Growth and characterization of freestanding GaN substrates," *J. Cryst. Growth*, 237, 912 (2002) ("Motokia 2002").

S. Nakamura et al., "The Blue Laser Diode: The Complete Story," Springer, New York, (2000) ("Nakamura 2000").

Y. Narukawa et al., "Improvement of luminous efficiency in white light emitting diodes by reducing a forward-bias voltage," *Japn J. Appl. Phys. Part 2 Letters*, 46, 963, (2007) ("Narukawa 2007").

H. Shibata et al., "High thermal conductivity of gallium nitride (GaN) crystals grown by HVPE process," *Materials Transactions*, 48, 2782 (2007) ("Shibata 2007").

K. Spariosu et al., "Efficient Er:YAG laser operating at 1645 and 1617 nm," *IEEE J. Quantum Electronics*, 42, 182 (2006) ("Spariosu 2006").

A. J. Steckl, et al., "Rare-earth-doped GaN: growth, properties, and fabrication of electroluminescent devices," *IEEE Journal of Selected Topics in Quantum Electronics*, 8, 749 (2002) ("Steckl 2002").

Z. Y. Sun et al., "Resonant excitation cross-sections of erbium in freestanding GaN bulk crystals," *Appl. Phys. Lett.*, 112, 202103 (2018) ("Sun 2018").

Z. Y. Sun et al., "Excitation and emission mechanisms of Er:GaN gain medium in 1.5 µm region," *Appl. Phys. Lett.*, 111, 072109 (2017) ("Sun 2017").

Z. Y. Sun et al., "Toward the realization of erbium-doped GaN bulk crystals as a gain medium for high energy lasers," *Appl. Phys. Lett.*, 109, 052101 (2016) ("Sun 2016").

N. Ter-Gabrielyan et al., "Resonantly pumped single-mode channel waveguide Er:YAG laser with nearly quantum defect limited efficiency," *Opt. Lett.*, 38, 2431 (2013) ("Ter-Gabrielyan 2013").

C. Ugolini, "Erbium-doped GaN epilayers synthesized by metal-organic chemical vapor deposition," *Appl. Phys. Lett.*, 89, 151903 (2006) ("Ugolini 2006").

J. Vetrovec, "Solid-state high-energy laser," *Proc. SPIE on Laser and Beam Control Technologies*, 4632, 104 (2002) ("Vetovec 2002").

U. Wahl et al., "Lattice location and optical activation of rare earth implanted GaN," *Mater. Sci. Eng. B*, 105, 132 (2003) ("Wahl 2003").

Q. Wang et al., "Emission and absorption cross-sections of an Er:GaN waveguide prepared with metal organic chemical vapor deposition," *Appl. Phys. Lett.*, 99, 121106 (2011) ("Wang 2011").

R. G. Wilson et al., "1.54-µm photoluminescence from Er-implanted GaN and AlN," *Appl. Phys. Lett.*, 65, 992 (1994) ("Wilson 1994").

J. M. Zavada et al., "Electroluminescent properties of erbium-doped III-N light-emitting diodes," *Appl. Phys. Lett.*, 84, 1061 (2004) ("Zavada 2004").

J. A. Zuclich et al., "Wavelength dependence of ocular damage thresholds in the near-IR to far-IR transition region: proposed revisions to MPES," *Health Phys.*, 92, 15 (2007) ("Zuclich 2007")

What is claimed is:

1. A core-cladding planar waveguide (PWG) structure comprising:
   (a) a core layer comprising Er:GaN, wherein the core layer has a uniform Er doping concentration;
   (b) a first GaN layer comprising undoped GaN; and
   (c) a second GaN layer comprising undoped GaN, wherein the core layer is between the first GaN layer and the second GaN layer;
   (d) a first transition layer that is between a first side of the first GaN layer and a first side of the core layer, wherein
      (i) a first side of the first transition layer is adjacent the first side of the first GaN layer, (ii) a second side of the first transition layer is adjacent the first side of the core layer, and (iii) Er doping of the first transition layer is increasing in concentration from the first side of the first transition layer to the second side of the first transition layer; and (e) a second transition layer that is between a first side of the second GaN layer and a second side of the core layer, wherein (i) a first side of the second transition layer is adjacent the second side of the core layer, (ii) a second side of the second transition layer is adjacent the first side of the second GaN layer, and (iii) Er doping of the second transition layer is decreasing in concentration from the first side of the second transition layer to the second side of the second transition layer.

2. The core-cladding PWG structure of claim 1, wherein (a) the Er doping of the first transition layer is increasing from a concentration of 0 at the first side of the first transition layer to the Er doping concentration of the core layer at the second side of the first transition layer; and (b) the Er doping of the second transition layer is decreasing from the Er doping concentration of the core layer at the first side of the second transition layer to a concentration of 0 at the second side of the second transition layer.

3. The core-cladding PWG structure of claim 2, wherein the uniform Er doping of the core layer has a concentration of at least $1 \times 10^{18}$ atoms/cm$^3$.

4. The core-cladding PWG structure of claim 2, wherein the uniform Er doping of the core layer has a concentration between $1 \times 10^{18}$ atoms/cm$^3$ and $1 \times 10^{22}$ atoms/cm$^3$.

5. The core-cladding PWG structure of claim 1, wherein the uniform Er doping of the core layer has a concentration of at least $1 \times 10^{18}$ atoms/cm$^3$.

6. The core-cladding PWG structure of claim 1, wherein the uniform Er doping of the core layer has a concentration between $1 \times 10^{18}$ atoms/cm$^3$ and $1 \times 10^{22}$ atoms/cm$^3$.

7. The core-cladding PWG structure of claim 1, wherein the uniform Er doping of the core layer has a concentration between $1 \times 10^{19}$ atoms/cm$^3$ and $1 \times 10^{21}$ atoms/cm$^3$.

8. The core-cladding PWG structure of claim 1, wherein the core-cladding PWG structure is a GaN/Er:GaN/GaN core-cladding PWG structure.

9. The core-cladding PWG structure of claim 1, wherein the core layer is co-doped with Er and Yb.

10. The core-cladding PWG structure of claim 9, wherein the Er and Yb doping of the core layer has a concentration between $1 \times 10^{18}$ atoms/cm$^3$ and $1 \times 10^{22}$ atoms/cm$^3$.

11. The core-cladding PWG structure of claim 1, wherein the core layer has a thickness of at least 5 µm.

12. The core-cladding PWG structure of claim 1, wherein in the core-cladding PWG structure is a strip having a longitudinal axis.

13. The core-cladding PWG structure of claim 12, wherein in the core-cladding PWG structure has a waveguide width that is at most ⅕ the length of the strip along the longitudinal axis.

14. A core-cladding planar waveguide (PWG) structure comprising:

(a) a core strip comprising Er:GaN, wherein (i) the core strip has a longitudinal axis, and (ii) the core strip has a uniform Er doping concentration; and (b) a GaN layer of undoped GaN that surrounds the core strip along the longitudinal axis; and (c) a transition layer that is between the GaN layer and the core strip, wherein ((i) a first side of the transition layer is adjacent the GaN layer along the longitudinal axis;

((ii) a second side of the transition layer is adjacent the core strip; and ((iii) Er doping of the transition layer is increasing in concentration between the first side of the transition layer to the second side of the transition layer.

15. The core-cladding PWG structure of claim 14, wherein the Er doping of the transition layer is increasing from a concentration of 0 at the first side of the transition layer to the Er doping concentration of the core stripe at the second side of the transition layer.

16. A core-cladding planar waveguide (PWG) structure comprising:

(a) a core strip comprising Er:GaN, wherein (i) the core strip has a longitudinal axis, and (ii) the core strip has a uniform Er doping concentration; and, (b) a first layer of Al$_x$Ga$_{1-x}$N that surrounds the core strip along the longitudinal axis, wherein x is between 0 and 1, inclusive; and (c) a transition layer between the core strip and the first layer, wherein the transition layer has an Er doping concentration that increases between (i) a first surface of the first transition layer adjacent to the first layer, and (ii) a second surface of the transition layer adjacent the core strip.

17. The device of claim 16, wherein the core-cladding waveguide (PWG) structure is a gain medium in the device.

18. The device of claim 17, wherein the device is selected from a group consisting of optical amplifiers, laser illuminators, and high-energy lasers.

19. The device of claim 18, wherein the device is operable to operate in a retina safe window.

20. The device of claim 18, wherein the device further comprises a resonant pump.

21. The device of claim 17, wherein the core-cladding PWG structure has a core region operable to have an optical confinement of at least 96%.

22. The device of claim 21, wherein the core-cladding PWG structure has a core region operable to have an optical confinement between 96% and 99%.

23. The device of claim 21, wherein the core-cladding PWG structure has a core region operable to have an optical confinement of at least 99%.

* * * * *